United States Patent
Kobayashi et al.

(10) Patent No.: US 6,354,792 B1
(45) Date of Patent: Mar. 12, 2002

(54) IC RECEIVING TRAY STORAGE DEVICE AND MOUNTING APPARATUS FOR THE SAME

(75) Inventors: Yoshito Kobayashi, Gyoda; Hiroto Nakamura, Kazo, both of (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/427,036

(22) Filed: Oct. 26, 1999

Related U.S. Application Data

(62) Division of application No. 08/648,133, filed on Jan. 8, 1997, now Pat. No. 6,070,731
(60) Provisional application No. PCT/JP95/01868, filed on Sep. 20, 1995.

(30) Foreign Application Priority Data

Sep. 22, 1994 (JP) .............................. 6-254362
Mar. 3, 1995 (JP) .............................. 7-70823

(51) Int. Cl.[7] .............................................. B65G 59/00
(52) U.S. Cl. ................. 414/796.7; 414/416; 414/795.6; 414/795.7
(58) Field of Search .............................. 414/416, 795.7, 414/795.6, 796.7; 206/725, 722, 459.5; 220/4.09, 4.26, 4.34, 23.4, 23.6

(56) References Cited

U.S. PATENT DOCUMENTS

| | | | |
|---|---|---|---|
| 3,701,079 A | 10/1972 | Bowden et al. | |
| 4,248,346 A | 2/1981 | Johnson | |
| 4,760,924 A | * 8/1988 | Sato et al. | 414/403 |
| 4,767,003 A | 8/1988 | Rice et al. | |
| 4,832,612 A | 5/1989 | Grabbe et al. | |
| 4,926,118 A | * 5/1990 | O'Connor et al. | 324/158 F |
| 5,067,911 A | 11/1991 | Saeki | |
| 5,073,079 A | * 12/1991 | Akagawa | 414/416 |
| 5,150,797 A | * 9/1992 | Shibata | 414/416 |
| 5,163,802 A | * 11/1992 | Poinelli | 414/555 |
| 5,269,412 A | 12/1993 | Doodson | |
| 5,313,156 A | 5/1994 | Klug et al. | |
| 5,435,687 A | * 7/1995 | Mojden et al. | 414/416 |
| 5,480,280 A | * 1/1996 | Bordon | 414/795.6 |
| 5,588,797 A | * 12/1996 | Smith | 414/416 |
| 5,674,047 A | * 10/1997 | Lapeus et al. | 414/795.6 |
| 5,685,589 A | * 11/1997 | Kikuchi et al. | 414/796.7 |
| 5,702,224 A | * 12/1997 | Kubota | 414/416 |
| 5,717,162 A | 2/1998 | Matsuoka | |
| 5,746,319 A | 5/1998 | Murphy | |

FOREIGN PATENT DOCUMENTS

| | | |
|---|---|---|
| JP | 62-215444 | 9/1987 |
| JP | 62-275934 | 11/1987 |

* cited by examiner

Primary Examiner—Douglas Hess
(74) Attorney, Agent, or Firm—Staas & Halsey LLP

(57) ABSTRACT

An IC receiving tray storage device is provided which is capable of securedly identifying the category of the tested ICs sorted for each category and received in the corresponding tray in the unloader section after end of test. Mounted to the tray storage is a casing comprising a generally rectangular base plate and a plurality of outer walls standing substantially upright and separately from each other on the base plate. A category identifying indicator is attached to at least one outer wall of the casing. This category identifying indicator indicates the category of ICs received in the tray. Also, in the base plate of the casing is formed an opening through which vertically movable unit is free to move. By the category identifying indicator, the category of the tested ICs received in the tray can be easily confirmed after the tray storage device has been taken out from the IC handler.

16 Claims, 8 Drawing Sheets

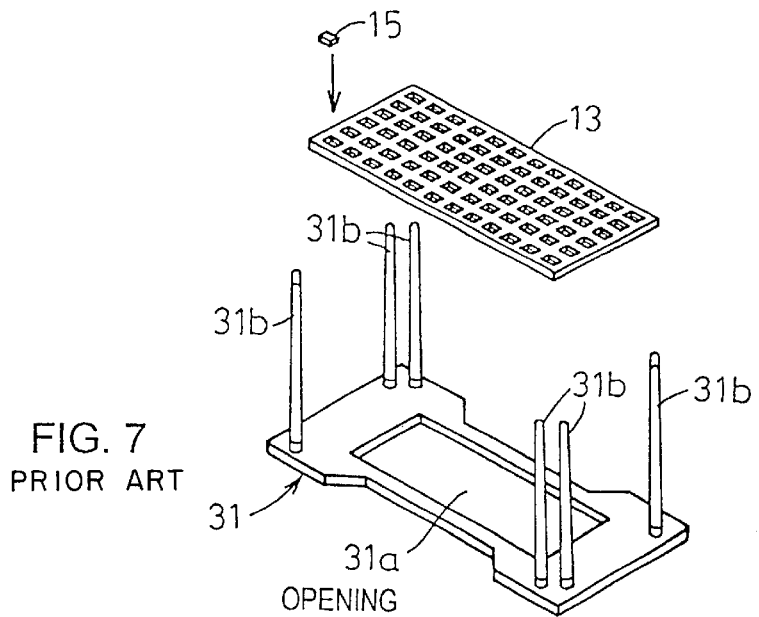
FIG. 7
PRIOR ART
FIG. 8B
PRIOR ART
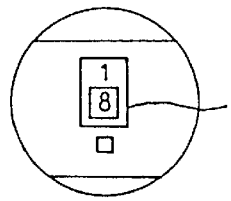
27 CATEGORY DISPLAY SECTION
FIG. 8A
PRIOR ART
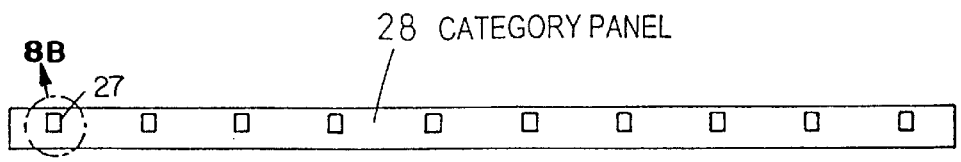
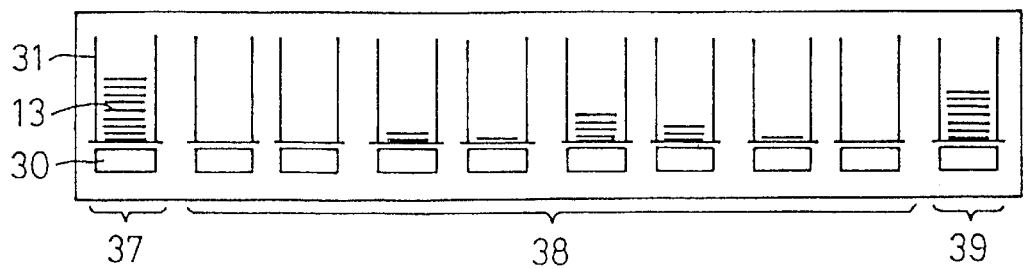

IC RECEIVING TRAY STORAGE DEVICE AND MOUNTING APPARATUS FOR THE SAME

This application is a divisional of application number 08/648,133, filed Aug. 1, 1997, now U.S. Pat. No. 6,070,731, which is a filing under 371 of International Ser. No. PCT/JP95/01868, filed Sep. 20, 1995.

BACKGROUND OF THE INVENTION

1. Field of the Invention

The present invention relates to an IC transporting and handling system (commonly referred to as IC handler) for transporting semiconductor devices, specifically ICs (semiconductor integrated circuits) which are typical examples thereof, to test them through a test section and to sort the tested ICs on the basis of the test results, and particularly, to a tray storage device for storing IC receiving trays each of which is used for receiving ICs to be tested or the tested ICs in an IC transporting and handling system and a mounting apparatus for mounting one or more of such tray storage device at a predetermined position in the IC transporting and handling system.

2. Background of the Related Art

Many of semiconductor device testing apparatus (hereinafter referred to as IC tester) for measuring the electrical characteristics of semiconductor devices by applying signals of a predetermined test pattern to devices to be tested, i.e. devices under test (commonly called DUT) have a semiconductor transporting and handling apparatus (hereinafter referred to as IC handler) integrally incorporated therein for transporting semiconductor devices for testing and sorting the tested semiconductor devices on the basis of the test results.

An example of the prior art IC handler called "forced horizontal transporting system" is shown diagrammatically in FIG. 1. The illustrated IC handler 10 comprises a loader section 11 where ICs 15 to be tested which a user has beforehand loaded on a customer (user) tray 13 are transferred and reloaded onto a test tray 14 capable of withstanding high/low temperatures, a constant temperature or thermostatic chamber 20 including a test section or testing zone 21 for receiving and testing the ICs from the loader section 11, and an unloader section 12 where the tested ICs 15 which have been carried on the test tray 14 out of the constant temperature chamber 20 subsequently to undergoing a test in the test section 21 are transferred from the test tray 14 to the customer tray 13 to be reloaded on the latter (generally, the tested ICs are often sorted into categories based on the data of the test results and transferred onto the corresponding customer trays 13 each for one category). Depending upon the type of ICs to be tested (in the case of the surface mount type ICs or the like packaged in a dual-in-line flat packages, for example), each IC may be loaded on an IC carrier, and then the IC carrier loaded with the IC may be placed on a customer tray.

The test tray 14 is moved in a circulating manner from and back to the loader section 11 sequentially through the constant temperature chamber 20 and the unloader section 12. More specifically, the test tray 14 loaded with ICs 15 to be tested is transported from the loader section 11 to a soak chamber 22 within the constant temperature chamber 20 where the ICs 15 placed on the tray 14 are heated or cooled to a predetermined constant temperature. Generally, the soak chamber 22 is adapted to store a plurality of (say, nine) test trays 14 stacked one on another such that a test tray 14 newly received from the loader section 11 is stored at the uppermost of the stack while the bottom test tray is delivered to the test section 21.

The ICs 15 to be tested are heated or cooled to a predetermined constant temperature while the test tray 14 is moved from the top to the bottom of the stack within the soak chamber 22. The heated or cooled ICs 15 together with the test tray 14 are then transported while maintained at the constant temperature from the soak chamber 22 to the test section 21 where the ICs under test are brought into electrical contact with IC sockets (not shown) disposed in the test section 21 to be measured for their electrical characteristics.

Upon completion of the test, the tested ICs 15 are transported from the testing zone 21 to an exit chamber 23 where they are restored to the ambient temperature. Like the soak chamber 22, the exit chamber 23 is also adapted to accommodate test trays in the form of a stack. For example, the arrangement is such that the tested ICs 15 are brought back to the ambient temperature as the associated test tray is moved sequentially from the bottom to the top of the stack within the exit chamber 23. Thereafter, the tested ICs 15 as carried on the test tray 14 are passed to the unloader section 12 where the tested ICs are sorted by categories based on the data of the test results and transferred onto the corresponding customer trays 13. The test tray 14 emptied in the unloader section 12 is delivered back to the loader section 11 where it is again loaded with ICs 15 to be tested from the customer tray 13 to repeat the same steps of operation.

It is to be noted that the transfer of ICs already tested as well as ICs to be tested between the customer tray 13 and the test tray 14 is typically effected by suction transport means utilizing a vacuum pump which may pick up one to several ICs at a time for the transfer.

While the IC handler 10 illustrated in FIG. 1 is of the type which is configured to transport ICs under test as placed on the tray, IC handlers of the type adapted to transport ICs under test individually are also currently used.

In the illustrated example, the test section 21 is so arranged that those in odd-numbered rows, for example, of the ICs under test carried on one test tray 14 are first tested, followed by those in even-numbered rows being tested. For this reason, two test trays 14 are shown in the test section 21. This is because the number of ICs to be tested at one time by an IC tester is limited (say, up to thirty-two), while too many (sixty-four, for example) ICs to be tested at one time are carried on one test tray in this example. One test tray is adapted to accommodate sixty-four ICs in a matrix of 4 columns×16 rows.

It is also to be noted that there is still another type of IC handlers in which ICs to be tested are sequentially transferred from the tray into a socket or sockets for the test at a time and upon the test being completed the IC or ICs are transferred from the socket or sockets back onto the tray, in the test section 21.

Heretofore, in case of testing ICs to be tested by use of such IC handlers, a user places ICs 15 to be tested on a customer tray 13 and stores a plurality of, for example, about twenty of customer trays 13 each having ICs 15 to be tested thereon respectively within a tray storage device not shown (hereinafter referred to as tray cassette), and thereafter the user transports the tray cassette to the loader section 11 in an IC handler and takes out the customer trays 13 one by one from the tray cassette to arrange them on the loader section 11. This results from that there is provided no mechanism in prior IC handlers for automatically taking out the customer trays 13 from the tray cassette one by one and transporting the customer tray to the transfer position of the loader section 11. Accordingly, there is not provided in prior art IC handlers a mounting apparatus for setting a tray cassette or cassettes therewithin.

An example of the prior art tray cassette is shown in FIGS. 2 to 5 wherein FIG. 2 is a plan view of the prior tray cassette 40, FIG. 3 is a bottom view of the tray cassette 40, FIG. 4 is a right side view of the tray cassette 40 of FIG. 2, and FIG. 5 is a perspective view of the tray cassette 40. The tray cassette 40 comprises a rectangular base plate 44 and a frame structure of a rectangular shape in plan view integrally formed on the base plate 44 and having props or stays 43 each in a form of angle bar at four corners of the frame structure so that the tray cassette 40 opens at all four sides thereof. Also, as shown in FIG. 5, the tray cassette 40 is so constructed that a customer tray 13 on which ICs to be tested are placed is inserted into the tray cassette 40 from the bottom of the cassette 40. Therefore, the base plate 44 has an opening for receiving a customer tray within the cassette. This opening fully opens when four hooks 45 are withdrawn from the opening toward the outside so that a customer tray 13 can be inserted into or taken out from the cassette. In addition, the top surface 42 of the tray cassette 40 is open except for an elongated handle 41 formed at the central portion of the top surface 42 along the lengthwisely thereof, and hence the tray cassette 40 is adapted to be transported by a user gripping the handle with his hand.

In this manner, the prior tray cassette 40 is so constructed that a tray is inserted into or taken out from the bottom of the cassette 40, and so its workability or operation efficiency is low and also there is a disadvantage that the prior tray cassette cannot be used in modern automated IC handlers because the IC handlers use tray cassettes in which customer trays are automatically inserted into or taken out from the tops thereof. In addition, since the prior tray cassette 40 needs the operation or work as mentioned above that a user transports the tray cassette to the loader section and takes out the customer trays one by one from the tray cassette to arrange them on the loader section, it takes a considerable time to accomplish the operation and hence there is a further disadvantage that the utilization factor or efficiency of an IC handler is low.

The applicant has previously devised automated IC handlers. Now, an example of the automated IC handler will be described with reference to FIGS. 6 to 9. Further, the automated IC handler is also a forced horizontal transporting system as mentioned above, and the construction thereof is the same as that of the above-mentioned IC handler in most portions or sections thereof. Accordingly, the parts or components of this automated IC handler corresponding to those of the IC handler shown in FIG. 1 are indicated by the same or like reference numerals or characters and the explanations thereof will be omitted unless the need arises.

FIG. 6 is a plan view showing roughly an example of the automated IC handler, FIG. 7 is a perspective view showing an example of the tray storage rack or stocker (hereinafter referred to as rack) together with a customer tray 13, the rack being stored in the tray storage rack receiving section (hereinafter referred to as rack section) in the IC handler of FIG. 6, FIG. 8 is a front view showing the rack section and an example of the category panel provided on the IC handler above the rack section, and FIG. 9 is a perspective view of the IC handler of FIG. 6. As shown in FIGS. 6 and 9, the illustrated automated IC handler 10, like the previously described IC handler 10 of FIG. 1, comprises a loader section 11 where ICs to be tested which a user has before-hand loaded on a customer (user) tray 13 are transferred and reloaded onto a test tray 14 capable of withstanding high/low temperatures, a constant temperature chamber including a test section for receiving and testing the ICs transported by the test tray 14 from the loader section 11, and an unloader section 12 where the tested ICs which have been carried on the test tray 14 out of the constant temperature chamber subsequently to undergoing a test in the test section are transferred from the test tray 14 to a customer tray 13 to be reloaded on the latter. The steps wherein the test tray 14 is moved in a circulating manner from and back to the loader section 11 sequentially through the constant temperature chamber and the unloader section 12, and the functions and operations of the respective sections are the same as those in the prior IC handler mentioned above and the explanations thereof will be omitted.

In the inside of the illustrated IC handler near to the front thereof are provided rack sections 37, 38, and 39 for accommodating customer trays 13 in the form of a stack, and each rack 31 is mounted on a corresponding pedestal 30 with a slide mechanism which is removable forward from the corresponding rack section. Accordingly, it can be easily done to mount and remove each rack 31 on and from the pedestal 30 by withdrawing each pedestal 30 forward from the rack section 37, 38 or 39. In addition, as shown in FIG. 9, disposed at the bottom of each of the racks 31 is an elevator (vertically movable means) 32 for lifting customer trays 13 stored in the rack 31. For this reason, the rack 31 is formed in its bottom with a generally rectangular opening 31a through which the associated elevator 32 is free to move vertically in the rack, as clearly shown in FIG. 7. Also, the pedestal 30 for receiving the rack 31 is, of course, formed with a similar opening through which the associated elevator 32 is free to move vertically in the pedestal.

As is shown in FIG. 7, the rack 31 comprises a generally rectangular base plate and eight props 31b each in the shape of a bar secured on four corners of the base plate two props per each corner, and customer trays 13 are received inside the props 31b. The length of each of the props 31b is generally selected so as to receive about twenty trays. The base plate is formed with the opening 31a through which the associated elevator 32 is free to move vertically in the base plate, and elongated recesses are formed oppositely along the longer sides of the base plate so as to make it easy to insert and take out a tray or trays into and from the rack by a user's hand. The shape of the base plate and/or the shape and the number of the prop can be arbitrarily varied or modified.

As best seen in FIG. 6, the illustrated IC handler 10 is provided with three rack sections, namely, the loader rack section 37, the unloader rack section 38, and the empty tray rack section 39, and it is shown to accommodate ten racks 31 in total within the IC handler 10. That is, the loader rack section 37 is capable of accommodating one rack 31, the unloader rack section 38 is capable of accommodating eight racks 31, and the empty tray rack section 39 is capable of accommodating one, respectively. The number of racks stored may be varied as desired. Further, it is to be noted that there is no definite demarcation between the loader, unloader and empty tray sections 37, 38 and 39 so that any number of racks may be distributed between the loader, unloader and empty tray sections 37, 38 and 39 as required. Of course, the rack for storing empty customer trays need not be one in number and may be housed in an other suitable location in the IC handler.

Mounted above the racks 31 is a tray transfer means 33 (hereinafter referred to as transfer arm) for conveying a customer tray or trays 13 of a particular rack to a desired position or another rack. The transfer arm 33 comprises a body supported by and movable along a guide rail installed horizontally (in right-left direction) as shown by phantom line in FIG. 6, and a pair of hooks which are engageable with engagement apertures formed in the customer tray 13. In the position shown in FIG. 6, the transfer arm 33 is movable transversely (in right-left direction) along the guide rail and also is supported to be movable vertically (in up-down direction). Accordingly, the transfer arm 33 can transfer the uppermost customer tray in a particular rack to a desired position or an another particular rack position by engaging the hooks of the transfer arm 33 with the engagement apertures of the uppermost customer tray in the particular rack and gripping this uppermost customer tray. 29 is a setting portion (set plate) for carrying the customer tray 13 transferred thereon from the loader section 11 by the transfer arm 33, and the ICs to be tested are transferred from the customer tray 13 placed on the setting portion 29 to a test tray 14.

It is noted that the illustrated IC handler is adapted to place two trays on the setting portion 29. Also, the illustrated IC handler is equipped with two similar setting portions in the unloader section 38 so that tested ICs may be sorted into categories based on the data of the test results and transferred concurrently from two test trays 14 onto corresponding customer trays placed on these setting portions. Further, in the loader section 11, ICs to be tested are first deposited from two customer trays 13 placed on the setting portion 29 onto a "preciser" 36 on which the ICs to be tested are precisely positioned prior to be transferred to the test tray 14.

Mounted above the IC handler are suction pick-up and transport means 34, 35 which are movable in a direction of X-axis (transverse or left-right direction in FIG. 6) as well as in a direction of Y-axis (forward-rearward or up-down direction in FIG. 6) perpendicular to the X-axis (hereinafter the suction pick-up and transport means 34 in the loader section 11 is referred to as loader head and the suction pick-up and transport means 35 in the unloader section 12 is referred to as unloader head). The loader head 34 is located generally above the loader section 11 and is supported to be movable by a guide rail installed in the direction of the X-axis in FIG. 6 as clearly shown in FIG. 9. This guide rail is supported to be movable at its opposite ends by a pair of opposed frames installed in the direction parallel to the direction of the Y-axis. Accordingly, the loader head 34 is movable in the direction of Y-axis between the customer tray 13 and the test tray 14 both located in the loader section 11 as well as along the transverse guide rail supporting the loader head 34 in the direction of X-axis.

Two unloader heads 35 are located in juxtaposition above the unloader section 12. Like the loader head 34, each of the unloader heads 35 is supported by a transversely extending guide rail installed in the direction of X-axis in FIG. 6 for movements therealong, and this guide rail is supported at its opposite ends by a pair of opposed frames installed in the direction parallel to the direction of Y-axis for movements along the frames in the direction of Y-axis. Accordingly, each unloader head 35 is movable in the direction of Y-axis between the customer tray 13 and the test tray 14 both located in the unloader section 12 as well as along the transverse guide rail supporting the unloader head 35 in the direction of X-axis.

As described previously, the ICs which have undergone the test are sorted into categories on the basis of the test results and are transferred to and stored in the corresponding customer trays 13 in the unloader section 12. Here, in the specification categories are referred to sorted numbers or sorted marks or symbols for classifying the devices into conforming (non-failure) articles and non-conforming (failure) articles and/or ranks or grades of the characteristic on the basis of the test results. For example, in the unloader section 12, the ICs which have undergone the first time test are sorted into typically two to eight categories on the basis of the test data. Generally, it is at the discretion of the operators of the various IC manufacturers to determine the number of categories depending on the purpose. When there are two categories, they are categories of "conforming article" and "non-conforming article". It is usual, however, to use the classification according to more than four categories. For example, those of the tested ICs which exhibit the best test data on the performance specification may be classified into the category 0, those showing good results be the category 1, those reaching the lowest acceptable limit of the performance specification be the category 2, and those found defective be the category 3.

The classification of the tested ICs into categories is performed by the selective operations of the unloader heads 35 based on the data of the test results, and empty trays 13 are conveyed from the rack in the empty tray rack section 39 to the tray setting portions in the unloader section 12 by the transfer arm 33. Also, a tray 13 fully filled with the tested ICs is gripped by the transfer arm 33 and is conveyed to and stored in the rack in the unloader rack section 38 corresponding to the predetermined category by a horizontal movement of the transfer arm 33. Categories for the racks in the rack section 37, 38, 39 are indicated on category display sections 27 of the category panel 28 (see FIG. 8) provided on the front 10a of the IC handler above the rack sections, respectively, and the category for the tested ICs received in the associated customer tray 13 can be identified by the corresponding category display section. FIGS. 8A and 8B show an example in which category numbers (1, 2, . . . ) are indicated on the respective category display sections 27.

In this manner, in the prior IC handler the categories for the tested ICs have been confirmed by the category numbers on the respective category display sections 27 of the category panel 28 on the front of the IC handler. Therefore, after the rack has been taken out from the IC handler, the identification of the category for each rack only depends on the operator's memory. As a result, there is a possibility that the misclassification of trays can arise from mistake of the operator's memory after the rack has been taken out from the IC handler.

SUMMARY OF THE INVENTION

It is an object of the present invention to provide a tray storage device for an automated IC handler which permits the IC handler to successively perform the test of ICs to be tested which have been received in a tray within the tray storage device by merely mounting the tray storage device on a tray storage device receiving section in the IC handler.

Another object of the present invention is to provide a tray storage device mounting apparatus for an automated IC handler which is capable of accurately positioning and mounting tray storage devices on tray storage device receiving sections in the IC handler.

A further object of the present invention is to provide a tray storage device for an IC handler which is capable of identifying the category of a tray which has received the tested ICs even after the tray storage device having stored the tray therein has been taken out from a tray storage device receiving section in the IC handler.

According to a first aspect of the present invention, an IC receiving tray storage device is provided which comprises: tray storage means comprising a generally rectangular base plate having an opening through which vertically movable means is free to move, and support means standing substantially upright on each corner of the base plate, IC receiving trays being received inside the support means; a casing comprising a generally rectangular base plate having an opening through which the vertically movable means is free to move and having engagement means at each corner of the base plate for engaging with the support means of the tray storage means, and a plurality of outer walls standing substantially upright and separately from each other on the base plate, the casing being adapted to accommodate and take out the IC receiving trays from the top thereof; and category identifying display means mounted to at least one outer wall of the casing for indicating a category of the tested semiconductor devices received in the IC receiving tray.

In accordance with the construction of the present invention as described above, since the IC receiving tray storage device is provided with the casing which can be easily mounted to a prior art tray storage rack, a category identifying indicator for indicating the category of tested ICs received in a tray can be attached to a front wall surface or an other wall surface or surfaces of the casing which can be easily confirmed from the outside. Thus, after the tray storage device has been taken out from an IC handler, the category of the tray storage device taken out from the handler is still indicated, and hence the operator has no need for keeping in mind that category of the tray storage device. As a result, the misclassification of trays owing to mistake of the operator's memory cannot be caused. Also, since the casing is provided, the stability of the tray storage device is improved when trays are stacked therein, and lifting of trays within the tray storage device by an elevator is done stably and securedly, and also transport and treating of the tray storage device are easy.

According to a second aspect of the present invention, an IC receiving tray storage device is provided which comprises: a generally rectangular base plate having an opening through which vertically movable means is free to move, and having positioning engagement means adapted to permit the tray storage device to be positioned accurately on a tray storage device mounting apparatus of the IC transporting and handling system; two outer walls standing substantially upright and separately from each other on the separate peripheral portions of the base plate including at least the longer sides of the base plate, respectively; handle storing means formed on about the central portions of the longer side surfaces of the two outer walls, respectively; and handles stored in the handle storing means, respectively, the handles being withdrawable outward therefrom.

According to a third aspect of the present invention, a tray storage device mounting apparatus is provided which comprises: at least one generally rectangular pedestal of a frame structure for receiving a tray storage device and having a somewhat larger size than the bottom of the tray storage device; positioning engagement means for positioning the tray storage device at a predetermined position on the pedestal and engaging with positioning engagement means provided on the tray storage device; vertically movable means for lifting upward a tray or trays stored in the tray storage device; and tray transfer means provided above the tray storage device within the tray storage device mounting apparatus, and for gripping and transferring the uppermost tray stored in the tray storage device when the uppermost tray becomes empty.

BRIEF DESCRIPTION OF THE DRAWINGS

FIG. 7 is a perspective view showing an example of the prior art rack used in the IC handler of FIG. 6 together with a tray;

FIGS. 8A and 8B are front views showing an example of the prior art category panel provided on the front of the IC handler of FIG. 6 together with rack sections;

DESCRIPTION OF THE PREFERRED EMBODIMENTS

Now, the preferred embodiments of the present invention will be described in details with reference to the accompanying drawings.

Figure 10:
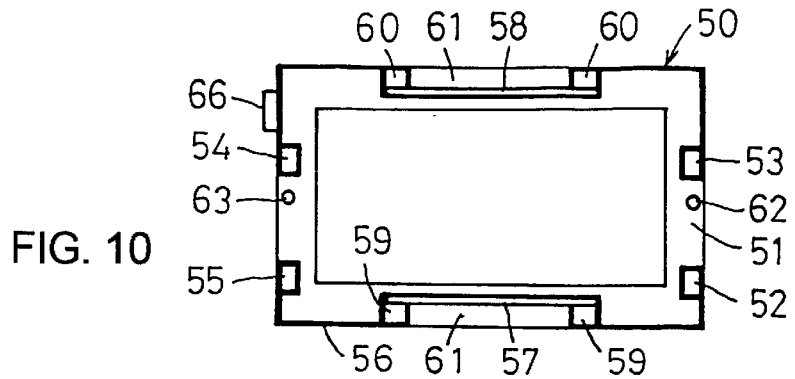
FIG. 10 is a plan view showing a first embodiment of the tray cassette according to the present invention.
Figure 11:
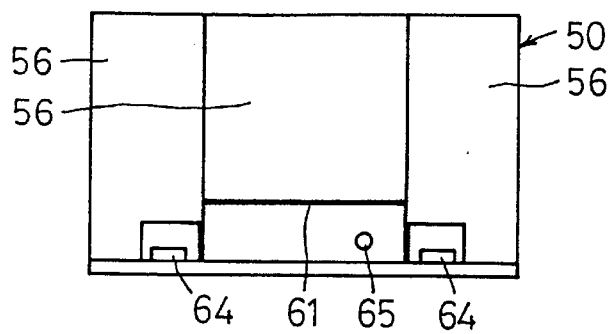
FIG. 11 is a front view of the tray cassette of FIG. 10.
Figure 12:
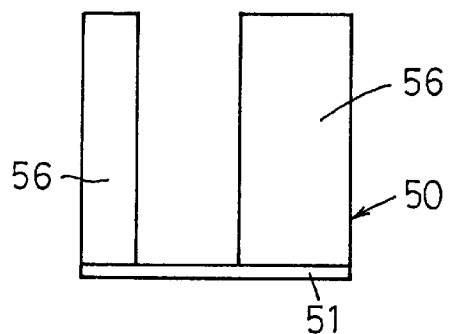
FIG. 12 is a right side view of the tray cassette of FIG. 10.
Figure 13:
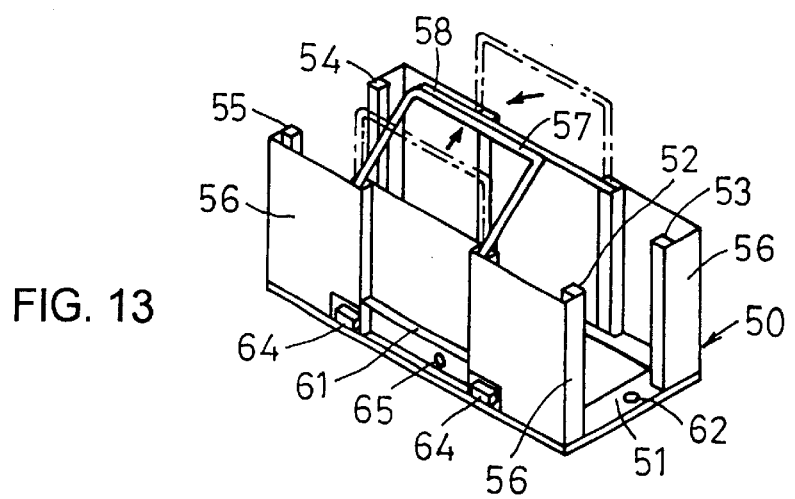
FIG. 13 is a perspective view of the tray cassette of FIG. 10.

FIGS. 10 to 13 show a first embodiment of the tray cassette according to the present invention, wherein FIG. 10 is a plan view of the first embodiment, FIG. 11 is a front view of FIG. 10, FIG. 12 is a right side view of FIG. 10, and FIG. 13 is a perspective view of FIG. 10. The tray cassette 50 of this embodiment comprises a generally rectangular base plate 51, two outer walls 56 which substantially stand upright separately from each other at the longer sides of the base plate 51 inclusive of some portions of the shorter sides thereof respectively, handle storing portions 59, 60 formed at substantially the central portions of the longer side surfaces of the outer walls 56, and handles 57, 58 stored in and withdrawable from the handle storing portions 59, 60.

Each of the shorter sides of the base plate 51 has two square shape props or stays 52, 53 or 54, 55 integrally mounted on each shorter side at a predetermined interval, and one of the outer walls 56 spans between two props 52 and 55 opposed to each other lengthwisely of the base plate 51 via the associated longer side and the other of the outer walls 56 spans between two props 53 and 54 opposed to each other lengthwisely of the base plate 51 via the associated longer side. In this embodiment the first pair of opposed props 52, 55 are secured on the shorter sides near to the one longer side and the second pair of opposed props 53, 54 are secured on the shorter sides near to the other longer side. However, the positions or locations on which the props are mounted can be arbitrarily varied or changed. Also, the intervals between two props mounted on the respective shorter sides are provided so as to make it easy to insert and take out a tray or trays into and from the tray cassette by a user's hand. In addition, if a sufficient mechanical strength is obtained by only the outer walls 56, then it may be needless to mount the props 52 to 55 on each shorter side.

The tray cassette 50 of the present embodiment is adapted to accommodate a customer tray 13 on which ICs to be tested are placed not only from the top thereof but also from the bottom thereof, and so the base plate 51 has an opening formed therein for receiving a tray within the tray cassette, like the prior art tray cassette. This opening fully opens when four hooks 64 are withdrawn from the opening toward the outside so that a customer tray 13 can be inserted into or taken out from the cassette. Further, the size of each elevator is so preset that each elevator is free to move vertically in the base plate 51 through the opening even when the hooks 64 are fully pushed toward the opening from the outside and the end portions of the hooks 64 protrude in the opening.

The two outer walls 56 have respective recesses formed on the longer side surfaces along the longer sides of the base plate 51 by denting the central portions of the surfaces toward the inside of the tray cassette, and on both sides of each of the recesses are formed the handle storing portions 59, 60 for storing both legs of each of the U-shaped handles 57, 58 (see FIG. 13), respectively. Usually, the handles 57, 58 are stored in the handle storing portions, but only the horizontal upper portions (central leg portions) of the handles remain exposed. The recesses are separated into two portions of lower recesses and upper recesses by horizontal strips 61 formed at a lower portion of each of the recesses near to the base plate 51. The strips 61 function as handles by which a user can grip the tray cassette 50 with his both hands. Further, the lower recesses have an aperture 65 through which light emitted from an optical sensor (comprising a light emitting device and a light receiving device) passes. The optical sensor is adapted to detect whether the tray cassette 50 has a tray stored therein or not. It goes without saying that the apertures 65 are formed at positions in the lower recesses corresponding to the sides of the bottom (lowermost) tray received in the tray cassette 50.

Positioning holes 62, 63 are formed in the base plate 51 at about the central portions of the shorter sides thereof. The positioning holes 62, 63 are adapted to permit the tray cassette 50 to be positioned accurately on a tray cassette mounting apparatus of the IC handler described later. It is needless to say that positioning of the tray cassette may be effected by other suitable means other than the apertures 62, 63. Further, a memory 66 is attached to a lower portion of one of the outer walls positioned along one shorter side (left side in this embodiment). This memory 66 is adapted for storing information relating to a tray such as the category of this tray stored in the tray cassette, namely, the category of the ICs received in this tray or the like.

With the construction just described above, the tray cassette 50 of the first embodiment of the present invention can accommodate a tray or trays by merely inserting a tray or trays from the top thereof which is open. Therefore, a tray can be inserted into or taken out from the tray cassette 50 without need for operating the hooks and hence its work-ability or operation efficiency becomes higher. Moreover, since the top of the tray cassette 50 is open, it can be advantageously used in modern automated IC handlers so that there is no need of the operation or work that a user transports the tray cassette to the loader section and takes out the customer trays one by one from the tray cassette to arrange them on the loader section. As a result, it is possible to use an IC handler efficiently, that is, the utilization factor or efficiency of an IC handler becomes higher. In addition, on transporting the tray cassette, the handles 57, 58 can be used by withdrawing them outward from the handle storing portions and it is easy to grip the tray cassette 50, and also a user can grip the tray cassette 50 with his both hands by the strips 61 which function as handles. Further, since the handles 57, 58 can be stored in the handle storing portions, they cannot be a hindrance to taking in and out of trays and also the handles 57, 58 obstruct operation or work of an IC handler when they are mounted thereon. Furthermore, since the apertures 65 through which light emitted from an optical sensor can pass are formed in the lower portions of the tray cassette 50 (positions corresponding to the sides of the lowermost tray), when the last tray within the tray cassette 50 is lifted up therefrom by the associated elevator the empty of the tray cassette 50 is detected at once. Accordingly, the replacement of the empty tray cassette can be effected promptly, and in this regard, the workability or operation efficiency becomes higher, too.

Figure 14:
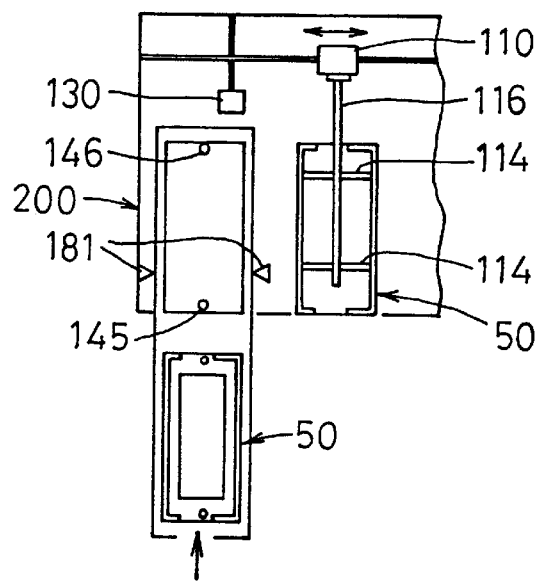
FIG. 14 is a plan view showing one embodiment of the tray cassette mounting apparatus according to the present invention with a portion thereof cut off.
Figure 15:
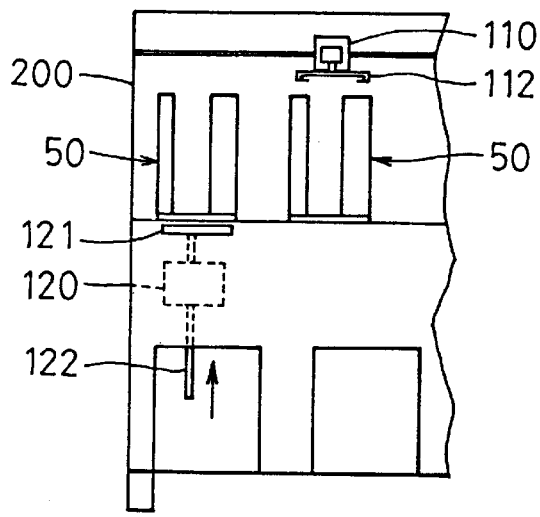
FIG. 15 is a front view of the tray cassette mounting apparatus of FIG. 14.
Figure 16:
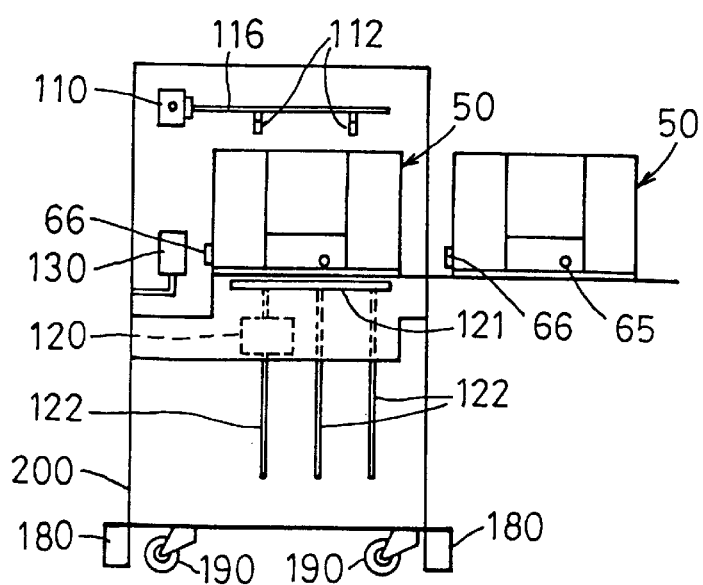
FIG. 16 is a left side view of the tray cassette mounting apparatus of FIG. 14.

Next, one embodiment of the tray cassette mounting apparatus will be described with reference to FIGS. 14 to 16, wherein FIG. 14 is a plan view showing one embodiment of the tray cassette mounting apparatus according to the present invention with a portion thereof cut off, FIG. 15 is a front view of the tray cassette mounting apparatus of FIG. 14, and FIG. 16 is a left side view of the tray cassette mounting apparatus of FIG. 14. The tray cassette mounting apparatus 200 comprises a generally rectangular pedestal of a frame structure for receiving a tray cassette 50 and having a somewhat larger size than the bottom of the tray cassette 50, the pedestal being withdrawable frontward by a slide mechanism as shown in FIG. 14, positioning pawls 145, 146 for positioning the tray cassette 50 at a predetermined position within the mounting apparatus 200 and engaging with the positioning holes 62, 63 of the tray cassette 50, an elevator 121 for lifting upward a customer tray or trays stored in the tray cassette 50, an optical sensor 181 (comprising a light emitting device and a light receiving device) provided at the position at which the optical sensor 181 is opposed to the light passing apertures 65 formed in the tray cassette 50 when the tray cassette 50 is positioned at a predetermined position within the mounting apparatus 200, and a memory information reading device 130 provided at the position at which the memory information reading device 130 is opposed to the memory 66 provided on the tray cassette 50.

Moreover, a tray transfer mechanism 110 is provided above the tray cassette 50 within the mounting apparatus 200. This tray transfer mechanism 110 can grip and transfer the uppermost tray stored in the tray cassette 50 to an empty tray receiving tray cassette when the uppermost tray becomes empty or transfer a customer tray or trays within a particular tray cassette to a desired position or another tray cassette. The tray transfer mechanism 110 comprises a body supported by and movable along a guide rail installed horizontally (in right-left direction in FIGS. 14 and 15), a rod-like bar 116 extending from the body horizontally in the direction orthogonal to the guide rail, and two arms 114 mounted to the bar 116 and having a pair of hooks 112 at both ends of each arm 114. The pair of hooks 112 are engageable with the engagement apertures formed in a customer tray. The transfer mechanism 110 is movable horizontally (right-left direction in FIGS. 14 and 15) along the guide rail and also is supported to be movable vertically (up-down direction in FIGS. 15 and 16). Accordingly, the transfer mechanism 110 can transfer the uppermost customer tray in a particular tray cassette to a desired position or an another particular tray cassette position by engaging the hooks 112 of the transfer mechanism 110 with the engagement apertures of the uppermost customer tray within the particular tray cassette and gripping this uppermost customer tray.

The tray cassette 50 is placed on a rectangular pedestal of a frame structure after the pedestal is withdrawn forward in front of the IC handler by a slide mechanism, as shown in FIG. 14. Thereafter, the pedestal is pushed into the inside of the handler and the positioning holes 62, 63 of the tray cassette 50 are engaged with the positioning pawls 145, 146 of the mounting apparatus 200. As a result, the tray cassette 50 is securedly positioned at a predetermined position within the mounting apparatus 200. Thus, the mounting operation of the tray cassette 50 on the mounting apparatus 200 can be easily effected and the withdrawing operation of the tray cassette 50 from the mounting apparatus 200 can also be easily done.

The elevator 121 causes a customer tray or trays within the tray cassette 50 to move up and down by the elevator shaft 122 being driven up and down by an elevator driving motor 120. For example, in the loader section 11, when ICs to be tested received in the uppermost tray within the tray cassette 50 becomes empty, the tray transfer mechanism 110 grips and transfers the uppermost tray to an empty tray receiving tray cassette or transfers it to other position. Then, the elevator driving motor 120 is driven to lift the next uppermost tray within the tray cassette to the uppermost position. Thereafter the same steps of operation are repeated. When the last tray is transferred, light emitted from the sensor remains in passing between the apertures 65 formed in both outer walls of the tray cassette 50, and so the empty of the tray cassette is detected.

Figure 1:
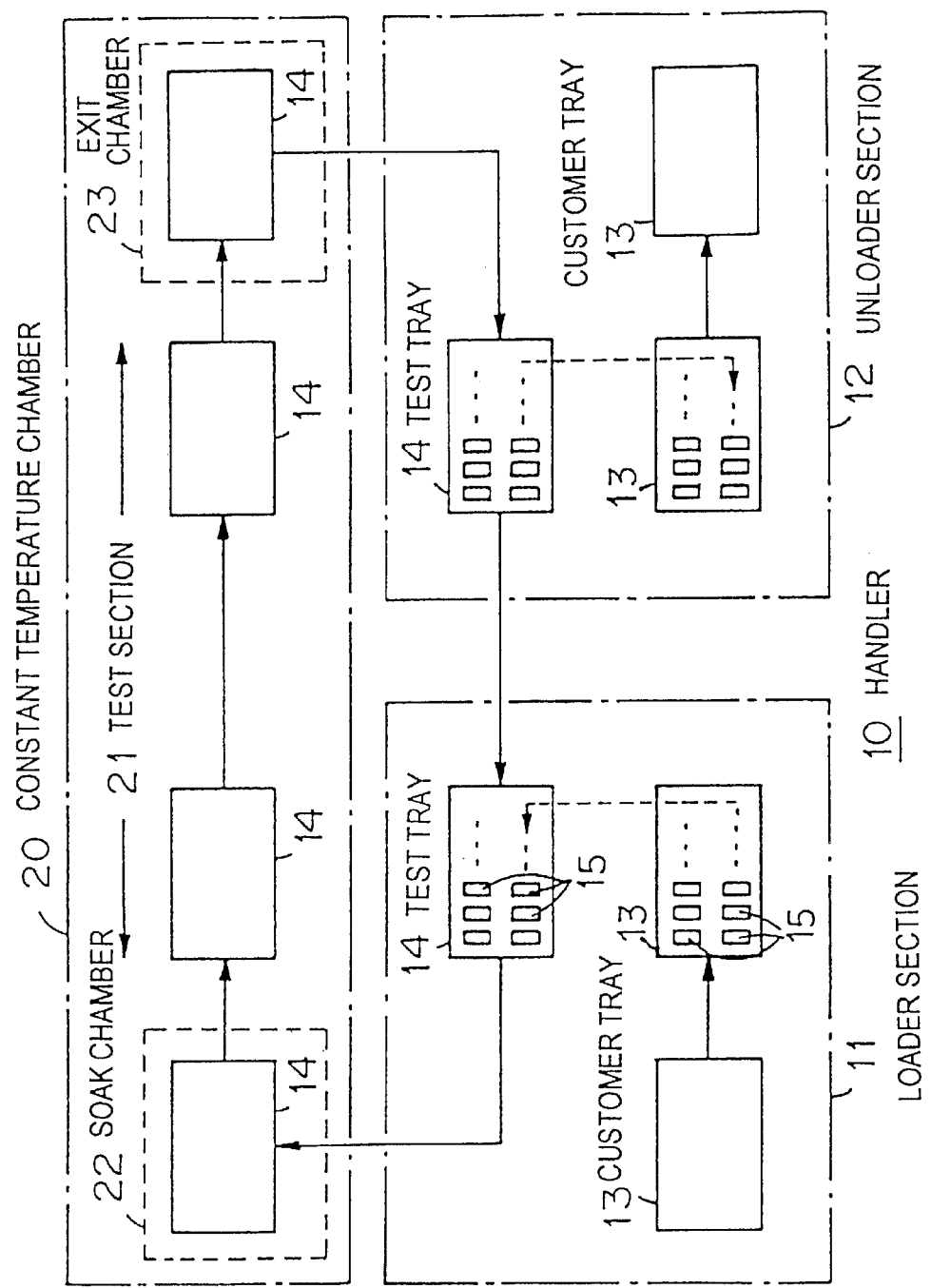
FIG. 1 is a diagrammatical illustration of the general arrangement of a conventional IC handler in the form of a forced horizontal transporting system.
Figure 2:
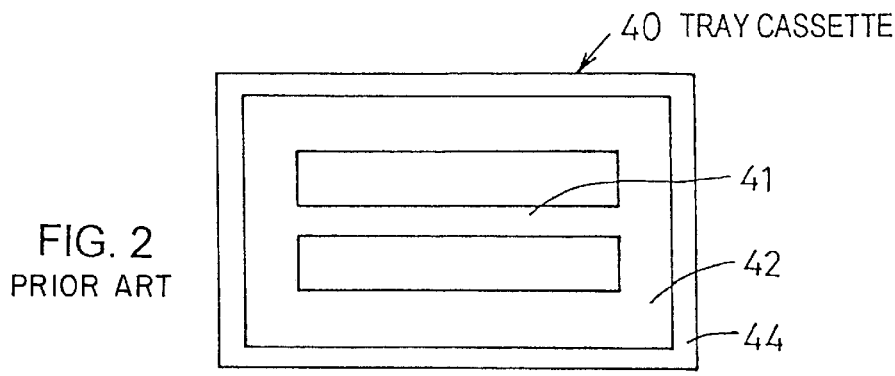
FIG. 2 is a plan view showing an example of the prior art tray cassette.
Figure 3:
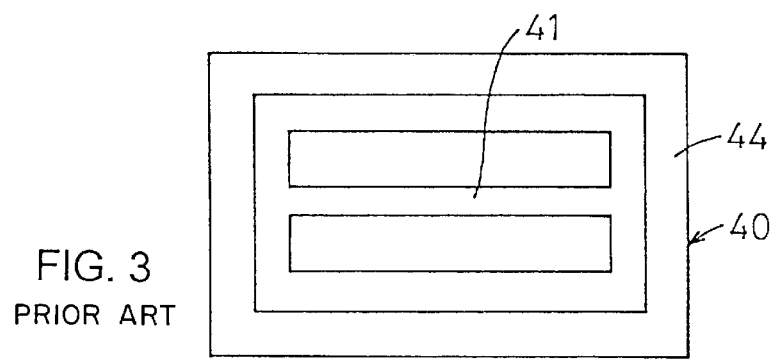
FIG. 3 is a bottom view of the tray cassette of FIG. 2.
Figure 4:
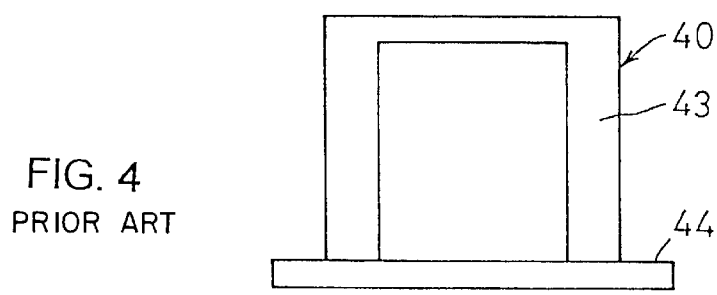
FIG. 4 is a right side view of the tray cassette of FIG. 2.
Figure 5:
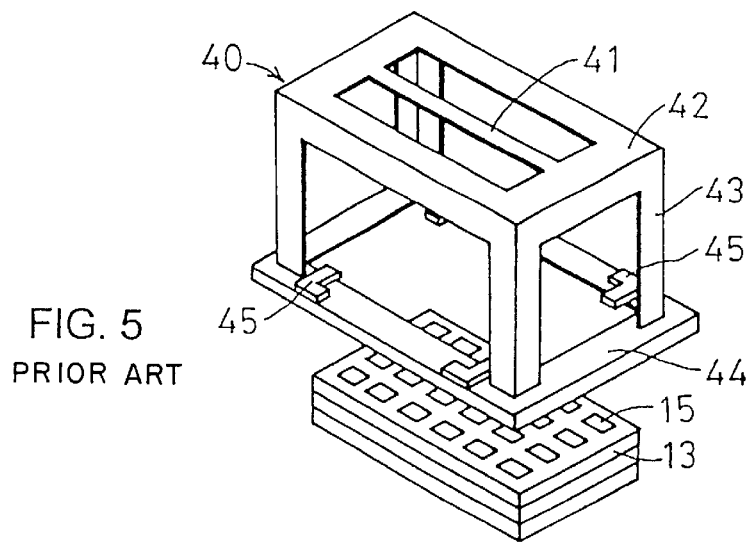
FIG. 5 is a perspective view of the tray cassette of FIG. 2.
Figure 6:
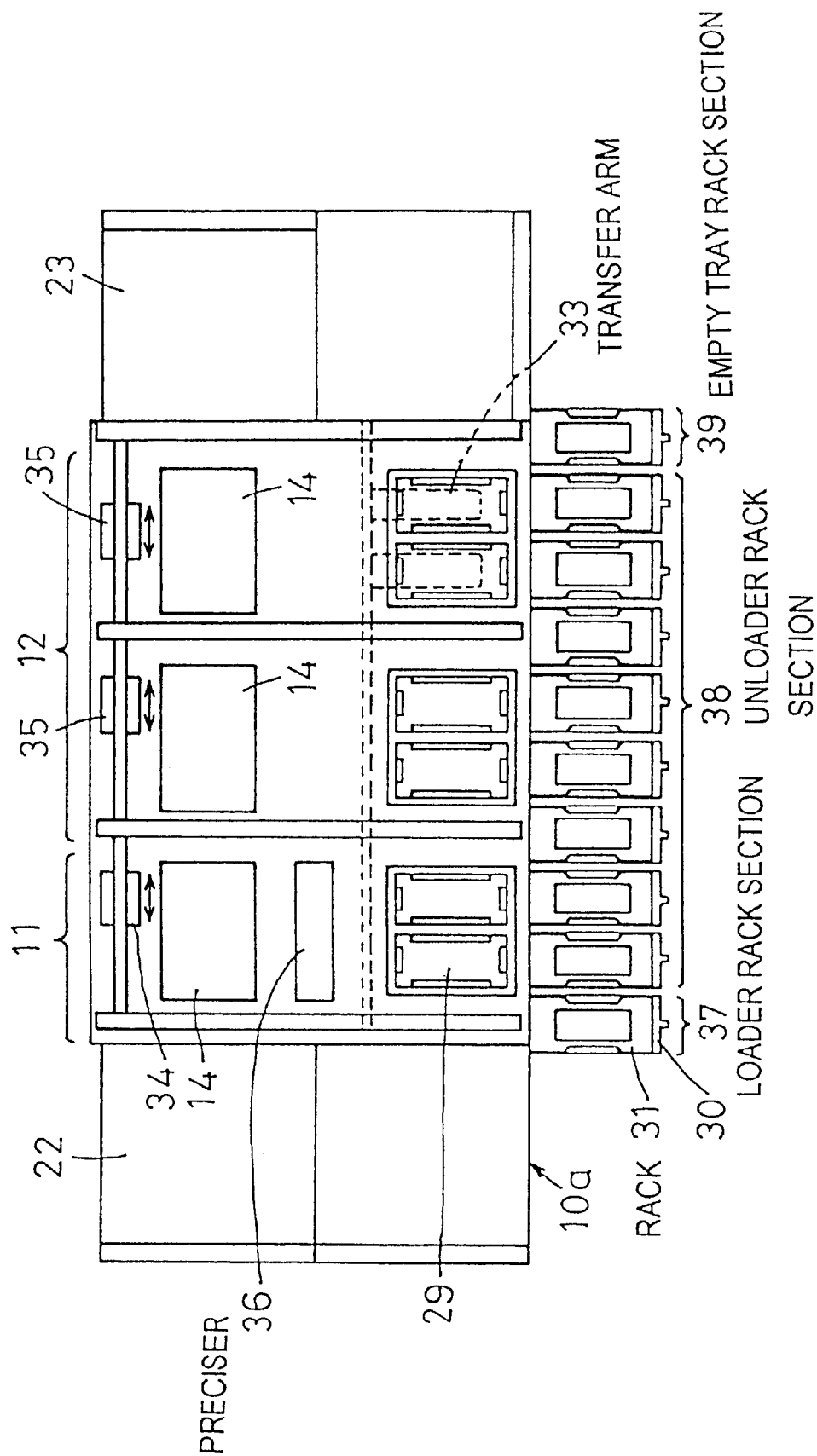
FIG. 6 is a plan view showing roughly the general arrangement of an example of the IC handler in the form of a forced horizontal transporting system to which the present invention can be applied.
Figure 9:
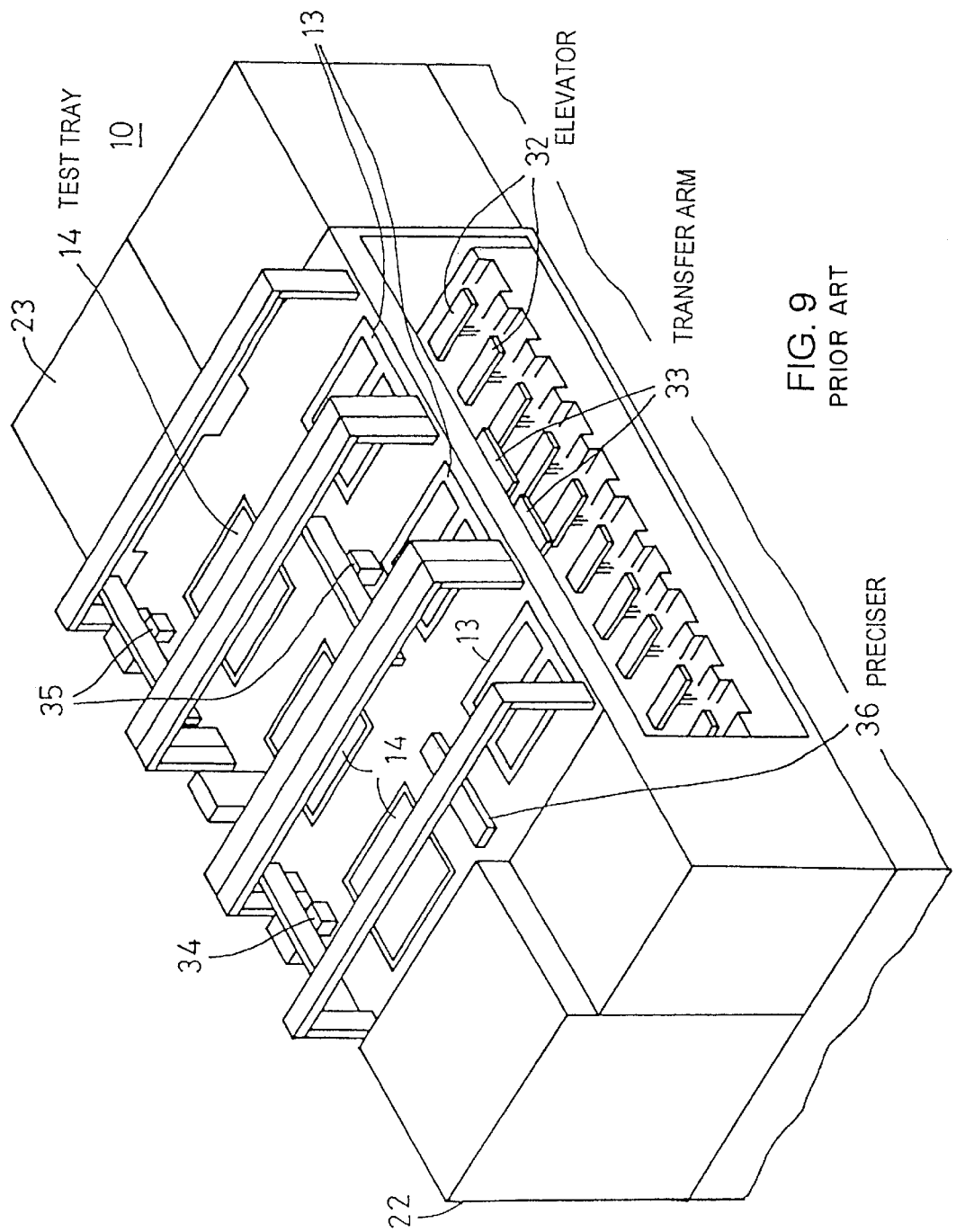
FIG. 9 is a perspective view of the IC handler of FIG. 6.

On the other hand, in case of the IC handler shown in FIG. 6, when the tray cassette 50 is mounted in the loader section 11, trays within the tray cassette 50 are sequentially conveyed to the loader setting portion by the tray transfer mechanism 110. Also, in the unloader section 12, in case of classifying the tested ICs received in the tray, the above-mentioned tray transfer mechanism 110 is also used to transfer trays each receiving ICs sorted for categories into the corresponding predetermined tray cassettes.

In order to make a fine adjustment of position easy when the tray cassette mounting apparatus 200 with the construction described above is installed in the IC handler, casters 190 are mounted on the bottom of the tray cassette mounting apparatus 200, and there are also mounted on the bottom of the tray cassette mounting apparatus 200 fixed stands 180 for securing the tray cassette mounting apparatus 200 after the fine adjustment of the position has been completed.

Figure 17:
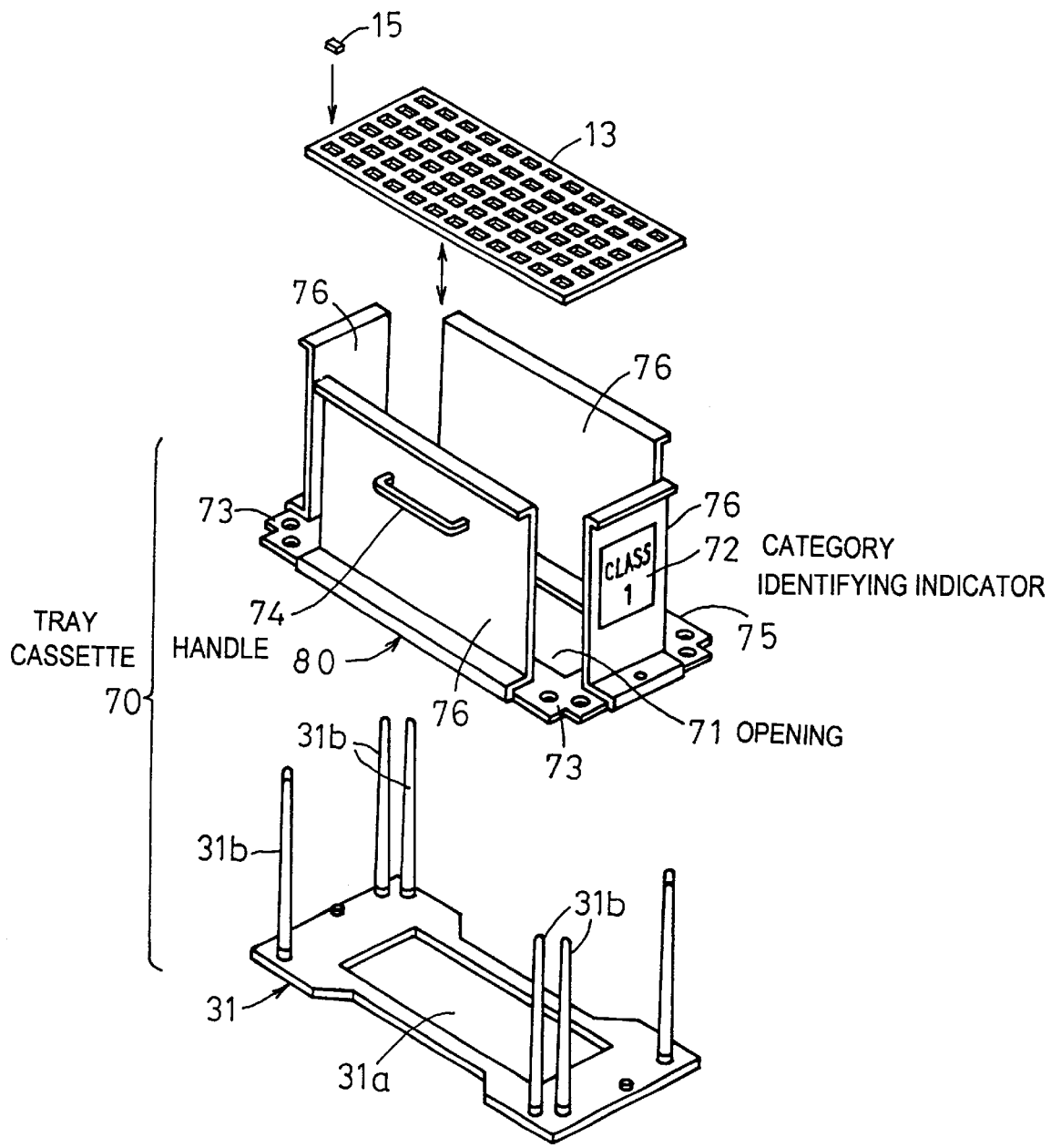
FIG. 17 is a plan view showing a second embodiment of the tray cassette according to the present invention together with a tray.

Next, the second embodiment of the tray cassette according to the present invention will be described with reference to FIG. 17. The tray cassette 70 of this embodiment comprises the rack 31 previously described, and a casing 80 comprising a generally rectangular base plate 75 having two through-holes at each corner 73 of the base plate 75 through which the two props 31b provided at each corner of the rack 31 are inserted, and four outer walls 76 standing substantially upright and separately from each other on the respective sides of the base plate 75. A category identifying indicator 72 is attached to one (one of the outer walls positioned at the shorter sides in this example) of the four outer walls 76 of the casing 80, and handles 74 are provided on the outer walls positioned at the longer sides, respectively. In addition, the base plate 75 of the casing 80 has an opening 71 through which an elevator is free to move. Further, the category identifying indicator 72 indicates the category of tested ICs 15 received in the tray 13 within the tray cassette 70 and may be, for example, a predetermined label of category number. Of course, the category identifying indicator 72 may be attached to two or more outer walls. Also, the intervals provided between four outer walls are to make it easy to insert and take out a tray or trays into and from the casing 80, and accordingly, the tray cassette 70, by a user's hand as well as to make it easy to confirm the number of the trays within the tray cassette 70 from the outside. Therefore, it may suffice that only two spaces are provided at opposite sides of the casing 80 as in the tray cassette 50 of the first embodiment described above. Further, while through-holes through which the props 31b of the rack 31 are inserted are formed at each corner of the casing 80, suitable engagement means such as U-shaped channel or the like other than the through-holes may be provided on the casing 80 and the casing 80 may be mounted to the rack 31 by the engagement means.

In this manner, since the tray cassette 70 of the second embodiment of the present invention is provided with the casing 80 which can be easily mounted to a prior art rack 31, a category identifying indicator 72 for indicating the category of the tested ICs 15 received in a tray 13 can be attached to a front wall surface or an other wall surface or surfaces of the casing 80 which can be easily confirmed from the outside. Thus, after the tray cassette 70 has been taken out from an IC handler, the category of the tray cassette 70 taken out from the handler is still indicated, and hence the operator has no need for keeping in mind that category of the tray cassette. As a result, the misclassification of trays owing to mistake of the operator's memory cannot be caused. Also, since the casing 80 is provided, the stability of the tray cassette is improved when trays are stacked therein, and lifting of trays within the tray cassette by an elevator is done stably and securedly, and also transport and treating of the tray cassette are easy. Further, since the tray cassette can be transported by the handles 74, it is convenient.

While there is described the case that the tray cassette and the mounting apparatus according to the present invention are used in an IC handler for transporting and handling ICs in the foregoing description, it is needless to say that the tray cassette and the mounting apparatus of the present invention can be used in semiconductor device transporting and processing systems for transporting and processing semiconductor devices other than ICs with equal functional effects. Also, they can be used in IC lead deformation testing apparatus for testing the deforming states of IC leads or IC stamping or sealing apparatus for stamping ICs with predetermined characters, marks or the like.

What is claimed is:

1. A tray storage device mounting apparatus adapted to be used in an IC transporting and handling system for transporting semiconductor devices from a loader section to a test section to test them through said test section and transporting the tested semiconductor devices from said test section to an unloader section where the tested semiconductor devices are sorted on the basis of the test results, said tray storage device mounting apparatus comprising:

a tray storage device having an opening in a bottom thereof and storing on the bottom a plurality of semiconductor device storing trays in a vertically stacked state to each other;

a generally rectangular pedestal of a frame structure with an opening for receiving thereon said tray storage device and having a somewhat larger size than the bottom of said tray storage device both said openings of said tray storage device and said pedestal being vertically aligned to each other when said tray storage device is loaded on said pedestal;

vertically movable means movable through both said openings of said pedestal and said tray storage device for vertically lifting up and down said vertically stacked trays stored in said tray storage device;

positioning means provided on said mounting apparatus for positioning the tray storage device at a predetermined position within said mounting apparatus by engaging with engagement means provided on the tray storage device; and tray transfer means provided above the tray storage device within the tray storage device mounting apparatus for gripping and transferring an uppermost one of the vertically stacked trays which are lifted up by said vertically movable means in the tray storage device.

2. The tray storage device mounting apparatus according to claim 1, further comprising an optical sensor provided at a position at which said sensor is opposed to light passing apertures formed in the tray storage device when the tray storage device is positioned at the predetermined position within said mounting apparatus.

3. The tray storage device mounting apparatus according to claim 2, further comprising memory information reading means provided at a position at which said memory information reading means is opposed to a memory provided on the tray storage device.

4. The tray storage device mounting apparatus according to claim 1, further comprising memory information reading means provided at a position at which said memory information reading means is opposed to a memory provided on the tray storage device.

5. A tray storage device mounting apparatus adapted to a semiconductor device transporting and handling apparatus wherein semiconductor devices are transported from a loader section to a test section where the semiconductor devises are tested and the tested semiconductor devices are transported from said test section to an unloader section where the tested semiconductor devices are sorted on the basis of the test results, said tray storage device mounting apparatus comprising:

a pedestal having a size larger than that of a bottom of a tray storage device for receiving thereon said tray storage device in which a plurality of trays are vertically stacked with each other, each of said trays being loaded thereon with semiconductor devices, and said tray storage device being provided thereon with engagement means;

positioning means provided within said mounting apparatus for positioning the tray storage device in a predetermined position within said mounting apparatus when the positioning means engages with engagement means of the tray storage device;

tray lift means for vertically lifting upward the trays vertically stacked with each other and stored in the tray storage device; and tray transfer means for gripping an uppermost tray of the trays stored in the tray storage device and lifted up at a predetermined ultimate lifted position by the tray lift means and for transporting the thus gripped tray to a desired position.

6. The tray storage device mounting apparatus according to claim 5, further comprising an optical sensor which comprises a light emitting device and a light receiving device, said optical sensor being opposed to light passing apertures formed in the tray storage device so that a light beam emitted from the light emitting device can reach the light receiving device through the light passing apertures when the tray storage device is positioned at the predetermined position on said pedestal.

7. The tray storage device mounting apparatus according to claim 6, further comprising memory information reading means provided to oppose to a memory provided on the tray storage device for reading out information stored in the memory when the tray storage device is positioned at the predetermined position within said mounting apparatus.

8. The tray storage device mounting apparatus according to claim 6, further comprising memory information reading means provided to oppose to a memory provided on the tray storage device for reading out information stored in the memory when the tray storage device is positioned at the predetermined position on said pedestal.

9. A tray storage device mounting apparatus used in a semiconductor device transporting and handling apparatus for mounting a tray storage device comprising:

a pedestal for receiving thereon a tray storage device which stores a plurality of trays in a vertically stacked state, each loaded thereon with semiconductor devices;

positioning means provided on said mounting apparatus for positioning the thus received tray storage device at a predetermined position within said mounting apparatus by engagement of the positioning means with engagement means provided on the tray storage device; and tray lift means for lifting the trays stored in the vertically stacked state in the tray storage device upward to thereby allow an uppermost tray of the stacked trays thus lifted up to be transported to a desired position by tray transfer means.

10. The tray storage device mounting apparatus according to claim 9, further comprising:

tray transfer means for gripping and transferring an uppermost tray of the trays stored in the vertically stacked state in the tray storage device when the uppermost tray is lifted at an uppermost position of the tray storage device by the tray lift means.

11. A tray storage device mounting apparatus used in a semiconductor device transporting and handling apparatus for mounting a tray storage device comprising:

a pedestal receiving thereon a tray storage device which stores a plurality of trays in a vertically stacked state, each said tray being loaded thereon with semiconductor devices, said pedestal having a larger size than a bottom of said tray storage device and being movable between in and out positions which are inside and outside of the mounting apparatus;

engagement means provided on the tray storage device;

positioning means provided on said mounting apparatus and engaging with the engagement means of the tray storage device for positioning the tray storage device at a predetermined position within said mounting apparatus; and tray lift means for lifting the trays stored in the vertically stacked state in the tray storage device upward.

12. The tray storage device mounting apparatus according to claims 11, further comprising:

tray transfer means for gripping and transferring an uppermost tray of the trays stored in the vertically stacked state in the tray storage device when the uppermost tray is lifted at an uppermost position of the tray storage device by the tray lift means.

13. A tray storage device mounting apparatus used in a semiconductor device transporting and handling apparatus for mounting a tray storage device comprising:

a pedestal for receiving a tray storage device storing a plurality of trays in a vertically stacked state, each loaded thereon with semiconductor devices, said pedestal having a larger size than a bottom of said tray storage device and being movable between in and out positions which are inside and outside of the mounting apparatus;

engagement means provided on the tray storage device;

positioning means provided on said mounting apparatus for positioning the tray storage device at a predetermined position within said mounting apparatus when the positioning means engages with the engagement means of the tray storage device while the pedestal loaded thereon with the tray storage device is located at its in position; and tray lift means for lifting the trays stored in the vertically stacked state in the tray storage device upward while the pedestal is located at its in position.

14. The tray storage device mounting apparatus according to claim 13, further comprising:

tray transfer means for gripping and transferring an uppermost tray of the trays stored in the vertically stacked state in the tray storage device when the uppermost tray is lifted at an uppermost position of the tray storage device by the tray lift means.

15. A tray storage device mounting apparatus for mounting a tray storage device at a predetermined position in a semiconductor device transporting and handling apparatus which transports semiconductor devices to be tested from a loader section to a test section where the semiconductor devices are tested and transports the tested semiconductor devices from said test section to an unloader section where the tested semiconductor devices are sorted into different categories on the basis of the test results, said tray storage device mounting apparatus comprising:

a pedestal for receiving thereon a tray storage device, said tray storage device having a casing for storing therein a plurality of trays which are vertically stacked with each other in said casing, each of said trays being loaded thereon with semiconductor devices, and said tray storage device being provided with engagement means;

positioning means provided on said mounting apparatus for positioning the tray storage device at a predetermined position within said mounting apparatus by engagement of the positioning means with the engagement means of the tray storage device;

tray lift means adapted for vertically lifting upward the trays stored in the vertically stacked state in the casing of the tray storage device when said tray storage device is positioned in the predetermined position within said mounting apparatus; and tray transfer means provided above the tray storage device within the tray storage device mounting apparatus for gripping an uppermost tray of the trays stored in the vertically stacked state in the casing of the tray storage device at a predetermined ultimate lifted position at which the uppermost tray is lifted by the tray lift means and for transporting the thus gripped uppermost tray to a desired position.

16. A mounting apparatus for mounting a plurality of tray storage devices each comprising a bottom plate and casing means for forming on said bottom plate a casing room in which a plurality of device trays are stored in a vertically stacked state to each other, each of said device trays being adapted to store semiconductor devices, said mounting apparatus comprising:

a plurality of pedestals, each comprising a pedestal plate and a carrying mechanism carrying said pedestal plate between inside and outside positions thereof which are inside and outside of the mounting apparatus, respectively;

a plurality of tray lift means each provided to correspond to each of the pedestals; and tray transfer means commonly provided above said pedestals for gripping, transferring, and releasing the device tray; wherein each of said tray storage devices is loaded on each of said pedestal plates when the pedestal plate is located at the outside position and carried into the mounting apparatus when the pedestal plate is located at the inside position by said carrying mechanism, said bottom plate of each said tray storage device has an opening, said pedestal plate of each said pedestal has an opening which is vertically aligned to the opening of the bottom plate of the tray storage device loaded thereon, each of said tray lift means is provided at such a location underneath the vertically aligned openings of the pedestal plate and bottom plate when the pedestal plate is located at the inside position, and vertically movable through the openings so as to vertically lift up and down the vertically stacked device trays stored in the casing room, and said tray transfer means is located at such a location above one of the pedestals where the vertically stacked device trays stored thereon are vertically lifted up by its tray lift means and grips an uppermost one of the thus lifted up device trays, so that upon completion of the vertically lifting down movement of the tray lift means, the thus gripped device tray is capable of being transferred to and released at the desired location.

* * * * *

UNITED STATES PATENT AND TRADEMARK OFFICE
CERTIFICATE OF CORRECTION

PATENT NO.   : 6,354,792 B1  Page 1 of 1
DATED        : March 12, 2002
INVENTOR(S)  : Yoshito Kobayashi et al.

It is certified that error appears in the above-identified patent and that said Letters Patent is hereby corrected as shown below:

<u>Column 14,</u>
Line 18, change "6" to -- 5 --.

Signed and Sealed this

Eighth Day of October, 2002

Attest:

JAMES E. ROGAN
Attesting Officer  Director of the United States Patent and Trademark Office